United States Patent [19]
Wilkinson

[11] Patent Number: 4,586,183
[45] Date of Patent: Apr. 29, 1986

[54] CORRECTING ERRORS IN BINARY DATA

[75] Inventor: James H. Wilkinson, Tadley, Near Basingstoke, United Kingdom

[73] Assignee: Sony Corporation, Tokyo, Japan

[21] Appl. No.: 561,782

[22] Filed: Dec. 15, 1983

[30] Foreign Application Priority Data

Dec. 17, 1982 [GB] United Kingdom ............... 8235962

[51] Int. Cl.⁴ .............................................. G06F 11/10
[52] U.S. Cl. ......................................... 371/39; 371/40
[58] Field of Search ............................ 371/37, 39, 40

[56] References Cited

U.S. PATENT DOCUMENTS

| 3,418,630 | 12/1968 | Van Duuren | 371/39 |
| 4,151,510 | 4/1979 | Howell et al. | 371/37 |
| 4,330,860 | 5/1982 | Wada et al. | 371/37 |
| 4,336,612 | 6/1982 | Inoue et al. | 371/39 |
| 4,356,564 | 10/1982 | Doi et al. | 371/40 |
| 4,413,339 | 11/1983 | Riggle et al. | 371/38 |
| 4,413,340 | 11/1983 | Odaka et al. | 371/39 |
| 4,447,902 | 5/1984 | Wilkinson | 371/39 |

Primary Examiner—Charles E. Atkinson
Attorney, Agent, or Firm—Lewis H. Eslinger; Alvin Sinderbrand

[57] ABSTRACT

A method of correcting errors in binary data which may represent a digital television signal, comprises dividing the data into a plurality of first blocks, each first block comprising a first plurality of, say sixty, data words and a second plurality of, say six, check words, and further deriving a parity check block for a plurality of the first blocks. Each check word is derived in dependence on all the data words in the first block and each other check word in the first block. One check word may be derived by modulo-2 addition and the remaining check words may be derived by respective primitive polynomial generators.

9 Claims, 18 Drawing Figures

CORRECTING ERRORS IN BINARY DATA

BACKGROUND OF THE INVENTION

1. Field of the Invention

This invention relates to methods of and apparatus for correcting errors in binary data, and particularly, but not exclusively, to methods of and apparatus for correcting errors in digital television signals after recording and reproduction.

2. Description of the Prior Art

It is now quite common for analog signals, such as audio or television signals, to be put into digital form, for example using pulse code modulation, for transmission or for recording. It is also quite usual to add some check words to the coded data words before transmission or recording for use on reception or reproduction to detect and correct errors in the received or reproduced data words. Sometimes the check words are derived quite simply as, for example, in the case of simple parity check words and cyclic redundancy check words. However, such simple methods generally imply a relatively low level of error detection or correction capability, or alternatively that a relatively large number of check words are required to achieve a desired level of security against errors. As all such check words are additional to the data words, and therefore in a sense redundant, more sophisticated methods of generating the check words, which result in an improved error detection and correction capability without undue increase in the number of check words required are in use particularly for digital television signals where the amount of data involved means that even without the additional of redundant words, very high bit rates have to be used. Examples of more sophisticated methods which have been used for digital television signals are various so-called b-adjacent codes, of which the Reed-Solomon code is a particular example, and the Bose-Chaudhuri-Hocquenghem code.

A common problem with prior methods of error detection and correction using check words is that if an error occurs in a check word, for example, during transmission or during recording and reproduction, this may mean that error detection and correction using that check word is impossible, or alternatively wrong error detection and correction may occur. In the case of a digital television signal either of these eventualities may result in serious deterioration of a reproduced television picture.

Another problem is that while the use of such an error detection and correction method using check words may permit the detection and correction of up to several errors in the block of data words protected by those check words, the method does not provide adequate protection against a burst error involving a substantial sequence of data words and caused, for example, by a tape drop-out.

Our European patent application No. 83304289.8 discloses methods of correcting errors in binary data using check words which are derived in dependence not only on data words to be protected but also in dependence on other check words. The present invention is concerned with developments of those methods.

One object of the present invention is to provide a method of correcting errors in binary data and in which the problems referred to above are alleviated.

Another object of the present invention is to provide apparatus for correcting errors in binary data which are not only dependent on associated data words but also on associated check words.

Another object of the present invention is to provide a method of correcting errors in binary data in which errors in check words can be detected and in some cases corrected.

According to the present invention there is provided a method of correcting errors in binary data, the method comprising assembling the data into a plurality of data blocks, each said data block comprising a first plurality of data words and a second plurality of check words, each said check word being derived in dependence on all said data words in said data block and each other said check word in said data block, and further deriving a parity check block for a plurality of said data blocks.

According to the present invention there is also provided apparatus for correcting errors in binary data, the apparatus comprising means for assembling the data into a plurality of data blocks, each said data block comprising a first plurality of data words and a second plurality of check words, means for deriving each said check word in dependence on all said data words in said data block and each other said check word in said data block, and means for further deriving a parity check block for a plurality of said data blocks.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
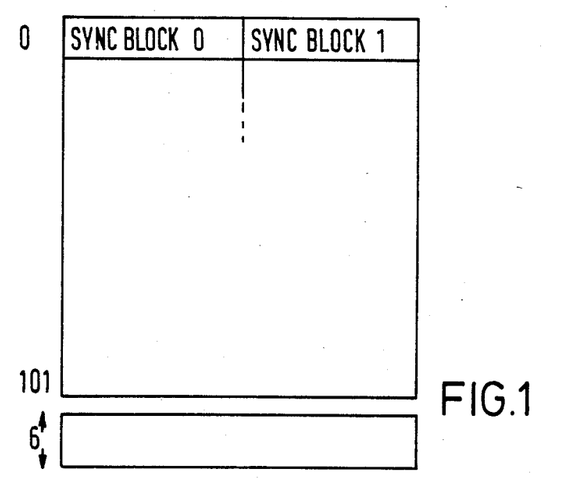
FIG. 1 indicates diagrammatically a coding format for a segment of one field of a digital television signal.

Referring to FIG. 1, this shows a coding format applied to a digital television signal. Each horizontal line scan of an incoming analog television signal has, as a preliminary, been sampled a predetermined number of times and each of the resulting samples has been pulse code modulation coded into an 8-bit data word. The part of the format shown in FIG. 1 covers a segment of data which represents 96 or, as shown in FIG. 1, 102 successive lines of a television field. Thus, for a PAL (or more generally a 625-line system) signal there will be three such segments per field, while for an NTSC (or more generally a 525-line system) signal there will be two-and-a-half such segments per field.

The particular sampling system used in this example is a so-called 2:1:1 system applied to a component television signal in which the luminance component signal is sampled at 6.75 MHz and each colour difference component signal is sampled at 3.375 MHz. This results in a total of 720 active samples per horizontal scan line or 13.5 megawords/second.

It will be appreciated that the invention can equally be applied to so-called 4:2:2 systems in which cases the numbers given per horizontal line scan are doubled, and to composite television signals, and moreover that the numbers given herein are merely by way of example.

The methods and apparatus to be described are generally applicable where the signals are to be transmitted and received, and in particular it will be assumed that the signals are to be recorded on and reproduced from a video tape recorder of the two-head or two-channel type, so that in each channel there are 360 active samples to be recorded for each horizontal scan line. For simplicity, only a single channel will be considered.

The 360 active samples are split into two sync blocks, each including 180 data words representing samples, and each sync block of 180 data words is split into three data blocks each including sixty data words.

Figure 2:
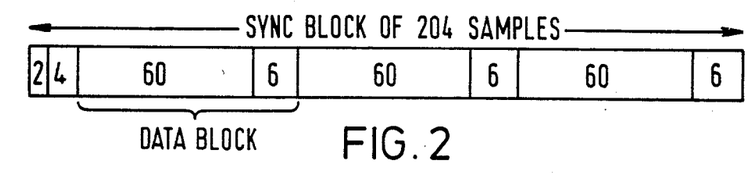
FIG. 2 indicates diagrammatically the coding format of part of one horizontal scan line of the segment of FIG. 1.

As shown in FIG. 2, to which reference is also now made, a complete sync block in fact consists of 204 words, as follows:

two synchronizing words
four address words
a first data block including sixty data words
six check words for the first data block
a second data block including sixty data words
six check words for the second data block
a third data block including sixty data words
six check words for the third data block.

As previously mentioned, the segment comprises 96 or 102 lines, and associated with the segment are a further six lines of vertical parity words. These vertical parity words are generated by bit-by-bit exclusive-OR (that is, modulo-2) addition of the individual bits of the words in every sixth line of the segment.

Figure 3:
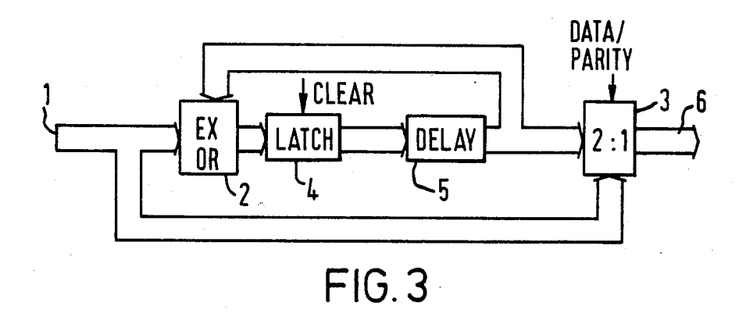
FIG. 3 shows in block form a vertical parity word generator for use in an encoder.

The vertical parity words are generated by a vertical parity word generator as shown in FIG. 3, before the synchronizing and check words have been added to the data blocks of data words of the segment. The parity word generator comprises an input 1 to which all the words of each of the lines 0 to 95 or 101 of the segment are supplied in sequence (the bits of each individual 8-bit word being supplied in parallel), the input 1 being connected to one input of an exclusive-OR circuit 2 and to one input of a 2:1 selector 3. The output of the exclusive-OR circuit 2 is connected to the input of a latch circuit 4, the output of which is connected to the input of a six-line delay (in fact, six lines minus one sample) 5, the output of which is connected to a second input of the exclusive-OR circuit 2 and also to the other input of the 2:1 selector 3. The 2:1 selector 3 is controlled to supply to an output 6 either the data, or to supply the generated vertical parity words thereto. When supplying the vertical parity words to the 2:1 selector 3, the latch circuit 4 is cleared so that the contents of the delay 5 are cleared down in preparation for the next segment of data.

Very briefly, the error detection and correction method to be described in detail below operates by using the check words of each data block to correct random bit errors, random word errors and also possibly short burst errors in the data words and the check words in the segment, and additionally to flag uncorrectable errors. Thus, if for example the check words of a given data block show that there are, or may be, more error words in the data block than can be corrected by the check words, then all the data words in that data block have an additional bit added thereto, this additional bit being set to say "1" to form an error flag. After this error detection and correction step, the vertical parity words are used, where possible, to correct the remaining errors. This error correction is possible where only one word of the sixteen or seventeen used to generate each vertical parity word is flagged as being in error. This means that in favourable circumstances a burst error of up to six sequential horizontal scan lines can be corrected using the vertical parity words. However, to obtain best results from the vertical parity correction, it is important that the random and short burst errors be reduced to the minimum possible, and it is therefore important that the coding system used for the check words has good error correction capabilities.

While for simplicity it will be considered in the present specification that successive data words in a data block represent successive samples along a horizontal scan line, in practice this is unlikely to be the case. The reason is that if the block contains an uncorrectable error pattern, then all the words of that block may be assumed to be in error even although some may still be correct. However, this is the prime method of error detection and this detection must be used before the concealment process. The chances of concealing such errors are substantially improved by dispersing them and it has therefore been previously proposed that after sampling the analog television signal and coding the samples, the resulting data words should be shuffled in order, for example using a random access memory (RAM) arrangement. Then, prior to decoding the data words, their order is de-shuffled using a complementary RAM arrangement.

Another previously proposed technique for improving error correction is interleaving, and that technique can also be used in the present error correction formats. The effect of interleaving is to spread errors, so that if a burst error occurs there is a greater probability of each of the individual word errors being corrected.

The method of generating the six check words of each data block will now be described. A particular feature of these check words is that they are generated not only in dependence on the sixty data words in the data block but also in dependence on each other. To assist understanding of this, some general theory or error correction coding and a known prior error correction code will first be discussed.

If one considers a sequence of binary digits, then an error can be sufficiently identified merely by its position. Thus if the position of the error bit is known the required correction is known because the bit can only have two values and the correct value must be the inverse of the actual value. If one considers a block of data words, that is a plurality of data words each consisting of a plurality of bits, then to identify an error sufficiently the position and the magnitude of the error need to be known.

Figure 4:
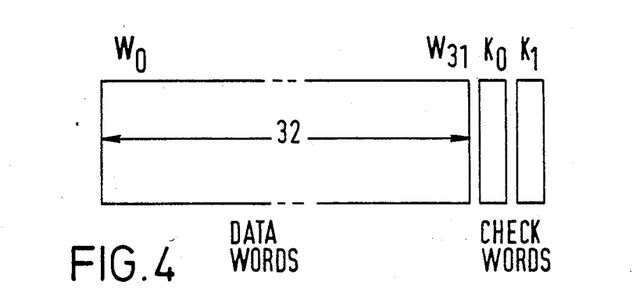
FIG. 4 indicates diagrammatically a block of data words with associated check words.

Referring to FIG. 4, consider a block of say thirty-two 8-bit data words $W_0$ to $W_{31}$. Each of the data words $W_0$ to $W_{31}$ represents in pulse code modulated form a sample level of an analog television signal, the sample range having 256 steps, that is $2^8$. Associated with the block are two 8-bit check words $K_0$ and $K_1$ to provide error correction of one 8-bit data word, by identifying the position of the word in error and the magnitude of the error. This might be considered as providing two simultaneous equations which are solved to find the two unknowns. For this to be possible the two check words must each be derived in dependence on all the data words in the block, but in different ways, so as to ensure that they include independent information and hence the equations are soluble. A so-called b-adjacent code is one way of obtaining this independence.

Figures 9A, 9B:
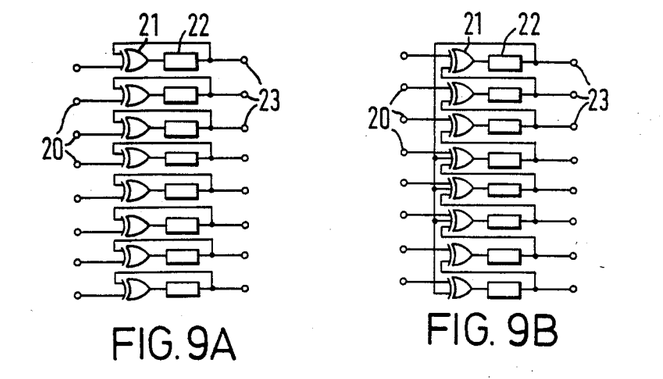
FIG. 9A and 9B show in block form respective primitive polynomial generators for use in generating the check words of FIG. 6.

Thus in the example of FIG. 4, the first check word $K_0$ is derived by the simple modulo-2 addition of all thirty-two data words. That is:

$$K_0 = W_0 \oplus W_1 \oplus W_2 \oplus \ldots \oplus W_{31} \quad (1)$$

where $\oplus$ represents modulo-2 addition, achieved by the circuit of FIG. 9A.

The second check word $K_1$ is derived using a primitive polynomial generator. Consider FIG. 5. The centre of the circle represents the 8-bit word 00000000. Around the circumference of the circle are 225 steps designated $\alpha^0, \alpha^1, \alpha^2, \ldots \alpha^{254}$ representing all the different non-zero patterns of an 8-bit code. The effect of the polynomial generator, which is conveniently formed as an 8-stage feedback shift register interconnected as shown in FIG. 9B, is to step an input data word clockwise around the circle when the shift register is clocked once. Thus if an 8-bit data word is stored in the shift register, the word may be considered as having been multiplied by $\alpha^0$, that is by one. If the shift register is then clocked once the word may be considered as having been multiplied by $\alpha^1$, and so on up to $\alpha^{254}$. One further clock brings the data word back to the original value. Because the polynomial is primitive any input 8-bit combination other than 00000000 supplied to the shift register will cycle in a predetermined manner through all the other possible combinations before returning to the original combination.

Figure 5:
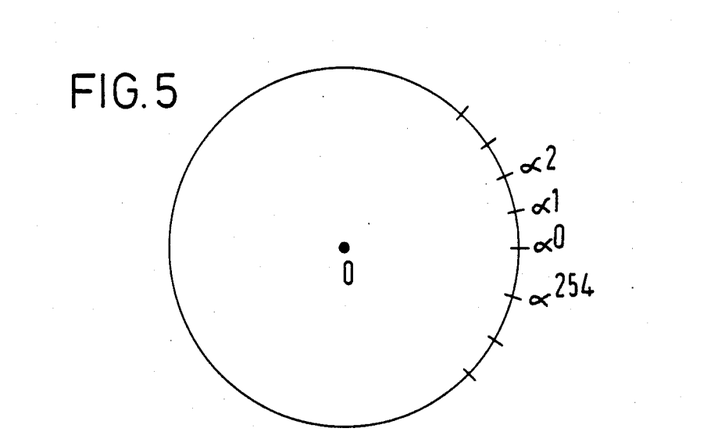
FIG. 5 illustrates diagrammatically the operation of a primitive polymonial generator.

To derive the check word $K_1$, the data word $W_0$ is supplied to the inputs of the shift register, which is then clocked once. The data word $W_1$ is modulo-2 added and the shift register is clocked once again. The data word $W_2$ is modulo-2 added and the shift register is clocked once again. This is continued until finally the data word $W_{31}$ is modulo-2 added. The first few steps can be represented as follows:

$$(W_0 \cdot \alpha^1) \oplus W_1 \quad (2)$$

$$((W_0 \cdot \alpha^1) \oplus W_1) \alpha^1 \oplus W_2 \quad (3)$$

$$(((W_0 \cdot \alpha^1) \oplus W_1) \alpha^1 \oplus W_2) \alpha^1 \oplus W_3 \quad (4)$$

Expression (4) can be re-written:

$$W_0 \alpha^3 \oplus W_1 \alpha^2 \oplus W_2 \alpha^1 \oplus W_3 \alpha^0 \quad (5)$$

Finally therefore we have:

$$K_1 = W_0 \alpha^{31} \oplus W_1 \alpha^{30} \oplus W_2 \alpha^{29} \oplus \ldots \oplus W_{31} \alpha^0 \quad (6)$$

In matrix form equations (1) and (6) can be written:

$$\begin{bmatrix} K_0 \\ K_1 \end{bmatrix} = \begin{bmatrix} \alpha^0 \alpha^0 \alpha^0 \ldots \alpha^0 \\ \alpha^0 \alpha^1 \alpha^2 \ldots \alpha^{31} \end{bmatrix} \begin{bmatrix} W_{31} \\ W_{30} \\ W_{29} \\ \cdot \\ \cdot \\ \cdot \\ W_0 \end{bmatrix} \quad (7)$$

A method of decoding used to derive from the check words $K_0$ and $K_1$ information as to the position and magnitude of an error will now be described. If it is assumed that one of the data words $W_x$ is in error, for example after the block of data words $W_0$ to $W_{31}$ with the two associated check words $K_0$ and $K_1$ have been recorded and reproduced, then the error $E_x$ can be taken as being modulo-2 added to the recorded data word $W_x$ resulting in the reproduced error data word $W_x \oplus E_x$.

After reproduction, two syndromes $S_0$ and $S_1$ are generated. The syndrome $S_0$ is the modulo-2 sum of $K_0$ and $K'_0$, $K'_0$ being derived in a similar manner to $K_0$ but from the reproduced data words $W'_n$. Therefore:

$$S_0 = (K_0) \oplus (K'_0) = \left\{ \sum_{n=0}^{31} W_n \right\} \oplus \left( \sum_{n=0}^{31} W_n \oplus E_x \right) = E_x \quad (8)$$

Thus if there is no error ($E_x = 0$), the syndrome $S_0$ will be zero and if there is an error ($E_x \neq 0$), the syndrome $S_0$ is equal to the magnitude of the error $E_x$.

The syndrome $S_1$ is the modulo-2 sum of $K_1$ and $K'_1$, $K'_1$ being derived in a similar manner to $K_1$ but from the reproduced data words $W'_n$. Therefore:

$$S_1 = (K_1) \oplus (K'_1) = \quad (9)$$

$$\left\{ \sum_{n=0}^{31} W_n \alpha^{31-n} \right\} \oplus \left( \sum_{n=0}^{31} W_n \alpha^{31-n} \oplus E_x \cdot \alpha^{31-x} \right)$$

$$= E_x \cdot \alpha^{31-x}$$

Thus if there is no error ($E_x = 0$) the syndrome $S_1$ will be zero and if there is an error ($E_x \neq 0$), the syndrome $S_1$ is equal to the magnitude of the error $E_x$ stepped back to the position of the error, that is by $31 - x$ steps, around the circle of FIG. 5.

Thus if the syndrome $S_1$ is stepped back $x - 31$ steps it will become equal to the magnitude of the error $E_x$, that is, equal to the syndrome $S_0$:

$$S'_1 = S_1 \cdot \alpha^{x-31} = E_x \cdot \alpha^0 = S_0 \quad (10)$$

To find the position of the error data word $W_x$, a Chien search is performed in which $S_1$ is repeatedly multiplied by $\alpha^{-1}$, that is it is stepped successively around the circle of FIG. 5 in an anti-clockwise direction, testing for $S'_1 = S_0$ at each step. When this condition is satisfied the position of the error has been found.

As a modification to the latter part of this method the syndrome $S_1$ can initially be multiplied by $\alpha^{-31}$. Thus equation (9):

$$S_1 = E x \cdot \alpha^{31-x} \tag{9}$$

is modified to give a new syndrome $S_1$, where:

$$S_1 = E x \cdot \alpha^{-x} \tag{10'}$$

The Chien search can then be repeatedly performed by multiplying by $\alpha^1$ and testing for $S_1 = S_0$ at each step. The advantages of this modification are that it avoids the need for reverse stepping, so a primitive polynomial generator of the same configuration as used in the coder can be used, and it requires only one delay store, rather than two first-in-last-out stores.

The above-described error correcting code will correct a single error without fail. Thus if the error is in one of the data words $W_0$ to $W_{31}$, the check words $K_0$ and $K_1$ will enable the magnitude and the position of the error to be determined. Moreover, if the error is in one of the check words $K_0$ or $K_1$, then one of the syndromes $S_0$ or $S_1$ will be zero and the other will be non-zero, thus indicating that the error is in one of the check words $S_0$ or $S_1$ and the data words $W_0$ to $W_{31}$ are error-free.

However, it will be seen that problems arise with this error correcting code in all cases where there are multiple errors, that is two or more errors. In such cases it would be advantageous if the error correcting code at least had some error detecting capability even in the cases where it could not effect error correction, so that remaining errors can be flagged for possible correction using the vertical parity words. Also in such cases it is important to reduce the probability of failure, that is where in the presence of two or more errors a wrong correction is made resulting in data which is in fact valid being invalidated. For a so-called perfect code, an example of which is the single error correcting Hamming code, the number of addresses identifiable by the check words is equal to the number of addresses where an error may occur. Inevitably therefore if there is more than one error, the Hamming code will assume a single error and make a wrong correction. For non-perfect codes, it is necessary to use that part of the code which is not used for correction as a means of detecting as best possible all error patterns outside the correction requirement of the code.

The code described above with reference to FIG. 4 is not perfect in this sense because the two syndromes $S_0$ and $S_1$ can assume $2^{16} - 1$ different non-zero patterns whereas the total possible number of error patterns is $2^8 - 1$, that is 255 (the number of possible word patterns) times 34 (the number of words). Clearly:

$2^{16} - 1$ is greater than 255 times 34 and this would still be true if the total number of words including the check words were increased to the maximum possible 255. This means that in theory at least some of the residual patterns are available for detection of multiple errors involving more than a single word.

To achieve this it is necessary to ensure that as many as possible of these residual patterns do not occur in correcting single errors.

By calculating the probabilities of failure associated with multiple errors it becomes apparent that the most troublesome situation is where there is an error in a check word, as in that case the code cannot distinguish whether this represents a single error in the check word or a multiple error in the data words. If the system assumes that it is a single error in the check word, then there is a significant probability of a data block containing at least two errors being passed as valid, while if the system assumes that there are two errors in the data block there is a significant probability of valid data word blocks being treated as invalid. The particular difficulty with errors in check words is that the other check word cannot give any information concerning the error, because the two check words are not related to each other in any way except through the data words.

Figure 6:
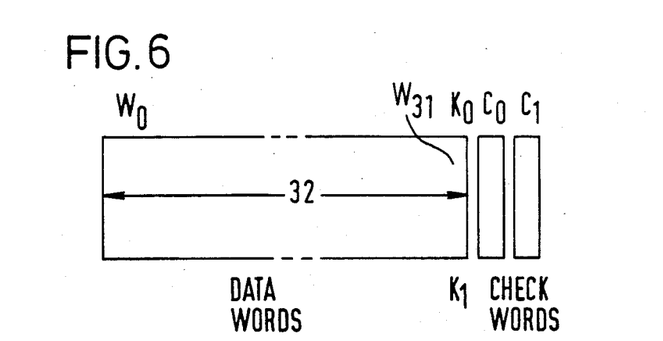
FIG. 6 indicates diagrammatically a further block of data words with associated check words.

A simplified version of the error correcting code used for generating the check words of each of the data blocks of FIG. 2 will now be described with reference to FIG. 6. As with FIG. 4, this shows a block of thirty-two 8-bit data words $W_0$ to $W_{31}$. Associated with the block are two 8-bit check words $C_0$ and $C_1$. Basically these check words $C_0$ and $C_1$ are derived in the same way as the check words $K_0$ and $K_1$ of FIG. 4. That is, the check word $C_0$ is formed as a modulo-2 sum and the check word $C_1$ is formed using a primitive polynomial generator, but whereas the check words $K_0$ and $K_1$ of FIG. 4 are both in effect related to the position 31 in the block, the check words $C_0$ and $C_1$ are in effect related to the position 33. In other words, whereas the check words $K_0$ and $K_1$ of FIG. 4 are derived in dependence on the data words up to and including the last data word $W_{31}$ in the position 31, the check words $C_0$ and $C_1$ of FIG. 6 are derived in dependence on the data words up to and including the last data word $W_{31}$ in the position 31 plus the check words $C_0$ and $C_1$ themselves in the positions 32 and 33.

Thus each of the check words $C_0$ and $C_1$ contains information concerning the other check word, so that in decoding, the check words $C_0$ and $C_1$ can be treated exactly as if they were data words, and if there is a single error the magnitude and position of the error can be determined even if the error is in one of the check words $C_0$ or $C_1$.

The problem, of course, is to generate the check words $C_0$ and $C_1$, and this is probably best explained mathematically. Equations (1) and (6) show how the check words $K_0$ and $K_1$ of FIG. 4 could be derived from the data words $W_0$ to $W_{31}$:

$$K_0 = W_0 \oplus W_1 \oplus W_2 \oplus \ldots \oplus W_{31} \tag{1}$$

$$K_1 = W_0 \alpha^{31} \oplus W_1 \alpha^{30} \oplus W_2 \alpha^{29} \oplus \ldots \oplus W_{31} \alpha^0 \tag{6}$$

Thus in the situation of FIG. 6, given the thirty-two data words $W_0$ to $W_{31}$, two intermediate words $K_0$ and $K_1$ related to the position 31 can be derived. Moreover, from FIG. 6 is will be seen that:

$$C_0 \cdot \alpha^0 = K_0 \alpha^0 \oplus C_1 \alpha^0 \tag{11}$$

and $$C_1 \alpha^0 = K_1 \alpha^2 \oplus C_0 \alpha^1 \tag{12}$$

Equations (11) and (12) can be re-written:

$$K_0 = C_0 \oplus C_1 \quad (13)$$

and $$K_1 = C_0 \alpha^{-1} \oplus C_1 \alpha^{-2} \quad (14)$$

In matrix form this becomes:

$$\begin{bmatrix} K_0 \\ K_1 \end{bmatrix} = \begin{bmatrix} \alpha^0 & \alpha^0 \\ \alpha^{-1} & \alpha^{-2} \end{bmatrix} \begin{bmatrix} C_0 \\ C_1 \end{bmatrix} \quad (15)$$

The centre matrix is in fact a Vandemonde determinant, so it always has a real inverse, and equation (15) can be solved for $C_0$ and $C_1$. In fact the solution when employing a primitive polynomial generator of the form shown in FIG. 9B represented by the equations:

$$X^8 = X^4 \oplus X^3 \oplus X^2 \oplus X^0 \quad (16)$$

is:

$$\begin{bmatrix} C_0 \\ C_1 \end{bmatrix} = \begin{bmatrix} \alpha^{230} & \alpha^{232} \\ \alpha^{231} & \alpha^{232} \end{bmatrix} \begin{bmatrix} K_0 \\ K_1 \end{bmatrix} \quad (17)$$

so the required check words $C_0$ and $C_1$ can readily be determined, most conveniently by using a programmable read-only memory (PROM) as a look-up table.

Figure 7:
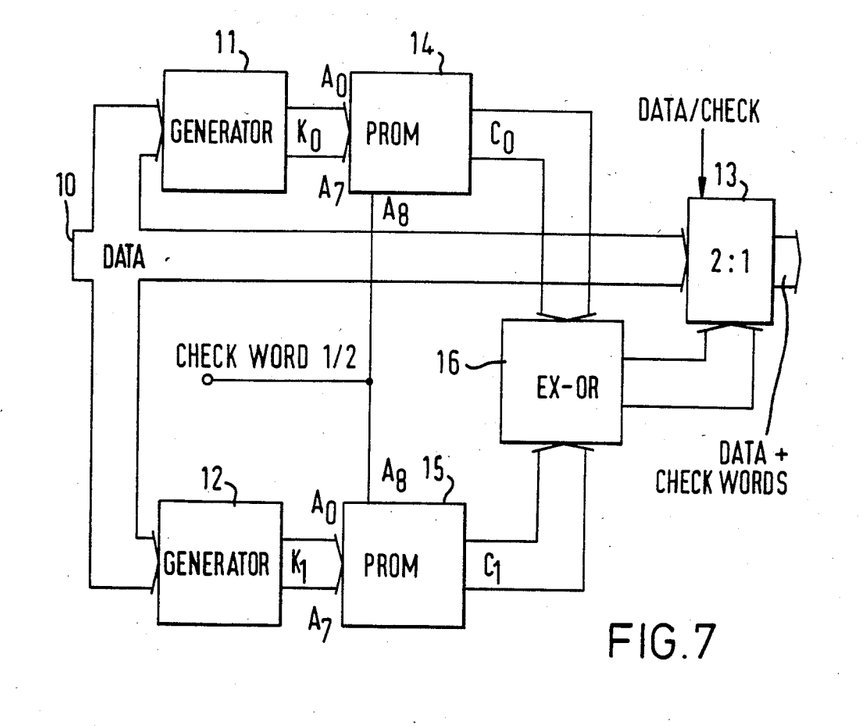
FIG. 7 shows in block form a circuit for generating check words in an encoder.

FIG. 7 shows in block schematic form a circuit for generating the check words $C_0$ and $C_1$. The incoming data words $W_0$ and $W_{31}$ are supplied by way of an input 10 to first and second primitive polynomial generators 11 and 12 which derive the intermediate words $K_0$ and $K_1$ respectively, and also to a 2:1 selector 13. The intermediate word $K_0$ derived by the primitive polynomial generator 11 is supplied to a (512×8) PROM 14 and the intermediate word $K_1$ derived by the primitive polynomial generator 12 is supplied to a (512×8) PROM 15. The intermediate words $K_0$ and $K_1$ are supplied to the input terminals $A_0$ to $A_7$ of the PROMs 14 and 15 respectively and to the input terminals $A_8$ are supplied switching signals to cause the PROMs 14 and 15 to operate alternately to derive the check words $C_0$ and $C_1$, which are supplied by way of an exclusive-OR circuit 16 to the 2:1 selector 13. The output of the 2:1 selector 13 is formed by the data words $W_0$ to $W_{31}$ with the associated check words $C_0$ and $C_1$.

In the decoder the procedure is basically as described above for the prior method of FIG. 4 but with the difference that instead of deriving the check words merely from the incoming data words, both the incoming data words and the incoming check words are used, and in consequence the syndromes are derived directly. If there are no errors in the check words then both syndromes are zero. If both the syndromes are non-zero then there is a single error, and the magnitude and position of this error can be found by a Chien search. It may be, of course, that this Chien search reveals that the single error is in one of the check words, in which case the data words are simply passed as valid, with no correction being necessary. If one syndrome is zero and the other is non-zero, then there is more than one error. An improved method of decoding will be described below.

Figure 8:
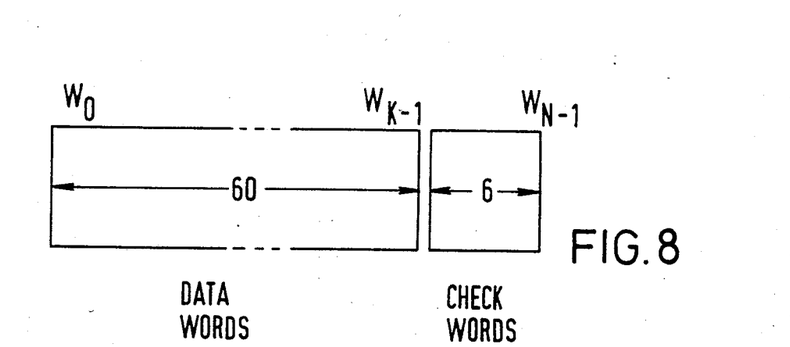
FIG. 8 indicates diagrammatically a still further block of data words with associated check words.

The example which has just been given is of course a very simple one, and does not have sufficient check information for a practical digital video tape recorder. The method used for the data format of FIGS. 1 and 2 will now be described with reference to FIGS. 8 to 11. FIG. 8 indicates diagrammatically the sixty data words $W_0$ to $W_{59}$ ($W_{K-1}$) of a data block, with which are associated the six check words. The use of six check words with sixty data words gives a level of redundancy which has been used in several prior methods, but the number of data words could be different, with appropriate changes to the formats of FIGS. 1 and 2, so long as the number $W_{K-1}$ lies within the range 6 to 254 inclusive.

Basically the data words with the six associated check words form a modified 3-error correcting Reed-Solomon code. It is not required to use the full 3-error correcting capability to correct errors within the data block and the associated check words, and this capability is used merely to correct one or two errors in the data words and the associated check words, the remaining redundancy being exploited for error detection, to implement the vertical parity correction on a segment of data.

In a conventional Reed-Solomon code the six check words would be derived from the matrix of extension field elements as follows:

$$\begin{bmatrix} K_0 \\ K_1 \\ K_2 \\ K_3 \\ K_4 \\ K_5 \end{bmatrix} = \begin{bmatrix} \alpha^0 \alpha^0 \alpha^0 \ldots \\ \alpha^0 \alpha^1 \alpha^2 \ldots \\ \alpha^0 \alpha^2 \alpha^4 \ldots \\ \alpha^0 \alpha^3 \alpha^6 \ldots \\ \alpha^0 \alpha^4 \alpha^8 \ldots \\ \alpha^0 \alpha^5 \alpha^{10} \ldots \end{bmatrix} \begin{bmatrix} W_{K-1} \\ W_{K-2} \\ W_{K-3} \\ \cdot \\ \cdot \\ W_0 \end{bmatrix} \quad (18)$$

where $K_0$ to $K_5$ represents the six check words respectively, and $W_0$ to $W_{K-1}$ represents the data words.

The check words $K_0$ to $K_5$ can be generated from the data words $W_0$ to $W_{K-1}$ using primitive polynomial generators as referred to above. The particular primitive polynomial generators required to generate the check words $K_0$ to $K_5$ are illustrated in block diagrammatic form in FIGS. 9A and 9B. Looking, for example, at FIG. 9B, each of the primitive polynomial generators comprises eight input terminals 20 each connected to one input of a respective exclusive-OR circuit 21, the output of which is connected to the input of a respective shift register stage 22, each having an output connected to a respective output terminal 23. Feedback connections as appropriate to generate the required polynomial also extend from the outputs of the shift register stages 22 to respective inputs of the exclusive-OR circuits 21.

Figure 10:
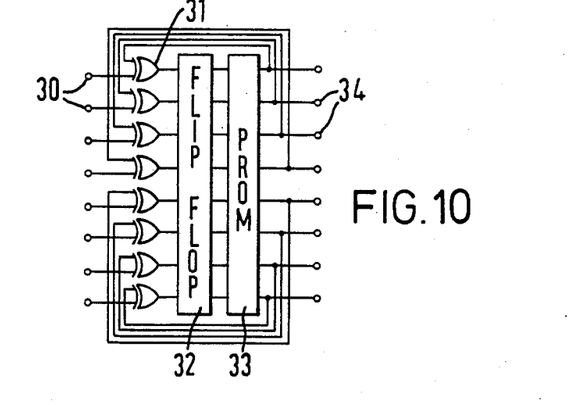
FIG. 10 shows in block form an alternative form of primitive polynomial generator for use in generating the check words of FIG. 8.

Although the remaining four polynomial generators can be made in a similar way they involve rather complex interconnections and so a substantial amount of hardware. As a preferred alternative, therefore, a primitive polynomial generator incorporating a PROM as shown in block form in FIG. 10 can be used. This primitive polynomial generator comprises input terminals 30 each connected to one input of a respective exclusive-OR circuit 31, the outputs of which are connected to an 8-way D-type flip-flop 32 having eight outputs respectively connected to eight inputs of a PROM 33 having eight outputs respectively connected to eight output terminals 34. Feedback connections also extend from the outputs of the PROM 33 to respective inputs of the exclusive-OR circuits 31. The primitive polynomial which is actually generated by this primitive polynomial generator depends on the programming of the PROM 33, and the same basic configuration can therefore be used to form the six primitive polynomial generators required for generating the check words $K_0$ to $K_5$.

In a conventional Reed-Solomon code, the check words $K_0$ to $K_5$ would be associated with the data block with no further processing. However, as described above, this does not provide effective security against errors in the check words themselves, particular where there is one error in a check word and one in a data word. As described above, therefore, the check words are modified so that each check word is dependent not only on all the data words but also on all the other check words.

Then if K is the number of data words in the block and N is the block length, the first stage check words are generated from the following matrix:

$$\begin{bmatrix} K_0 \\ K_1 \\ K_2 \\ K_3 \\ K_4 \\ K_5 \end{bmatrix} = \begin{bmatrix} \alpha^0 \alpha^0 \alpha^0 \ldots \alpha^0 \\ \alpha^0 \alpha^1 \alpha^2 \ldots \alpha^{(K-1)} \\ \alpha^0 \alpha^2 \alpha^4 \ldots \alpha^{2(K-1)} \\ \alpha^0 \alpha^3 \alpha^6 \ldots \alpha^{3(K-1)} \\ \alpha^0 \alpha^4 \alpha^8 \ldots \alpha^{4(K-1)} \\ \alpha^0 \alpha^5 \alpha^{10} \ldots \alpha^{5(K-1)} \end{bmatrix} \begin{bmatrix} W_{K-1} \\ W_{K-2} \\ \cdot \\ \cdot \\ W_1 \\ W_0 \end{bmatrix} \quad (19)$$

In other words, $K_0$ to $K_5$ are the check words which would conventionally be associated with the block. If we now define the check words which are actually to be used as $C_0$ to $C_5$ then the check words C and K are related by the following equations:

$$\alpha^0 C_0 = \alpha^0 K_0 \oplus \alpha^0 C_1 \oplus \alpha^0 C_2 \oplus \alpha^0 C_3 \oplus \alpha^0 C_4 \oplus \alpha^0 C_5 \quad (20)$$
$$\alpha^4 C_1 = \alpha^6 K_1 \oplus \alpha^5 C_0 \oplus \alpha^3 C_2 \oplus \alpha^2 C_3 \oplus \alpha^1 C_4 \oplus \alpha^0 C_5$$
$$\alpha^6 C_2 = \alpha^{12} K_2 \oplus \alpha^{10} C_0 \oplus \alpha^8 C_1 \oplus \alpha^4 C_3 \oplus \alpha^2 C_4 \oplus \alpha^0 C_5$$
$$\alpha^6 C_3 = \alpha^{18} K_3 \oplus \alpha^{15} C_0 \oplus \alpha^{12} C_1 \oplus \alpha^9 C_2 \oplus \alpha^3 C_4 \oplus \alpha^0 C_5$$
$$\alpha^4 C_4 = \alpha^{24} K_4 \oplus \alpha^{20} C_0 \oplus \alpha^{16} C_1 \oplus \alpha^{12} C_2 \oplus \alpha^8 C_3 \oplus \alpha^0 C_5$$
$$\alpha^0 C_5 = \alpha^{30} K_5 \oplus \alpha^{25} C_0 \oplus \alpha^{20} C_1 \oplus \alpha^{15} C_2 \oplus \alpha^{10} C_3 \oplus \alpha^5 C_4$$

The equations (20) must be solved for the check words $C_0$ to $C_5$. The equations can be rearranged in determinate form as follows:

$$\begin{bmatrix} K_0 \\ K_1 \\ K_2 \\ K_3 \\ K_4 \\ K_5 \end{bmatrix} = \begin{bmatrix} \alpha^0 & \alpha^0 & \alpha^0 & \alpha^0 & \alpha^0 & \alpha^0 \\ \alpha^{-1} & \alpha^{-2} & \alpha^{-3} & \alpha^{-4} & \alpha^{-5} & \alpha^{-6} \\ \alpha^{-2} & \alpha^{-4} & \alpha^{-6} & \alpha^{-8} & \alpha^{-10} & \alpha^{-12} \\ \alpha^{-3} & \alpha^{-6} & \alpha^{-9} & \alpha^{-12} & \alpha^{-15} & \alpha^{-18} \\ \alpha^{-4} & \alpha^{-8} & \alpha^{-12} & \alpha^{-16} & \alpha^{-20} & \alpha^{-24} \\ \alpha^{-5} & \alpha^{-10} & \alpha^{-15} & \alpha^{-20} & \alpha^{-25} & \alpha^{-30} \end{bmatrix} \begin{bmatrix} C_0 \\ C_1 \\ C_2 \\ C_3 \\ C_4 \\ C_5 \end{bmatrix} \quad (21)$$

Again, this is a Vandermonde determinant which always has a real inverse, and results in the following solution:

$$\begin{bmatrix} C_0 \\ C_1 \\ C_2 \\ C_3 \\ C_4 \\ C_5 \end{bmatrix} = \begin{bmatrix} \alpha^{229} & \alpha^{89} & \alpha^{142} & \alpha^{146} & \alpha^{101} & \alpha^{249} \\ \alpha^{88} & \alpha^{62} & \alpha^{7} & \alpha^{76} & \alpha^{170} & \alpha^{107} \\ \alpha^{140} & \alpha^{6} & \alpha^{4} & \alpha^{40} & \alpha^{82} & \alpha^{158} \\ \alpha^{143} & \alpha^{74} & \alpha^{39} & \alpha^{10} & \alpha^{19} & \alpha^{160} \\ \alpha^{97} & \alpha^{167} & \alpha^{80} & \alpha^{18} & \alpha^{80} & \alpha^{113} \\ \alpha^{244} & \alpha^{103} & \alpha^{155} & \alpha^{158} & \alpha^{112} & \alpha^{4} \end{bmatrix} \begin{bmatrix} K_0 \\ K_1 \\ K_2 \\ K_3 \\ K_4 \\ K_5 \end{bmatrix} \quad (22)$$

Figure 11:
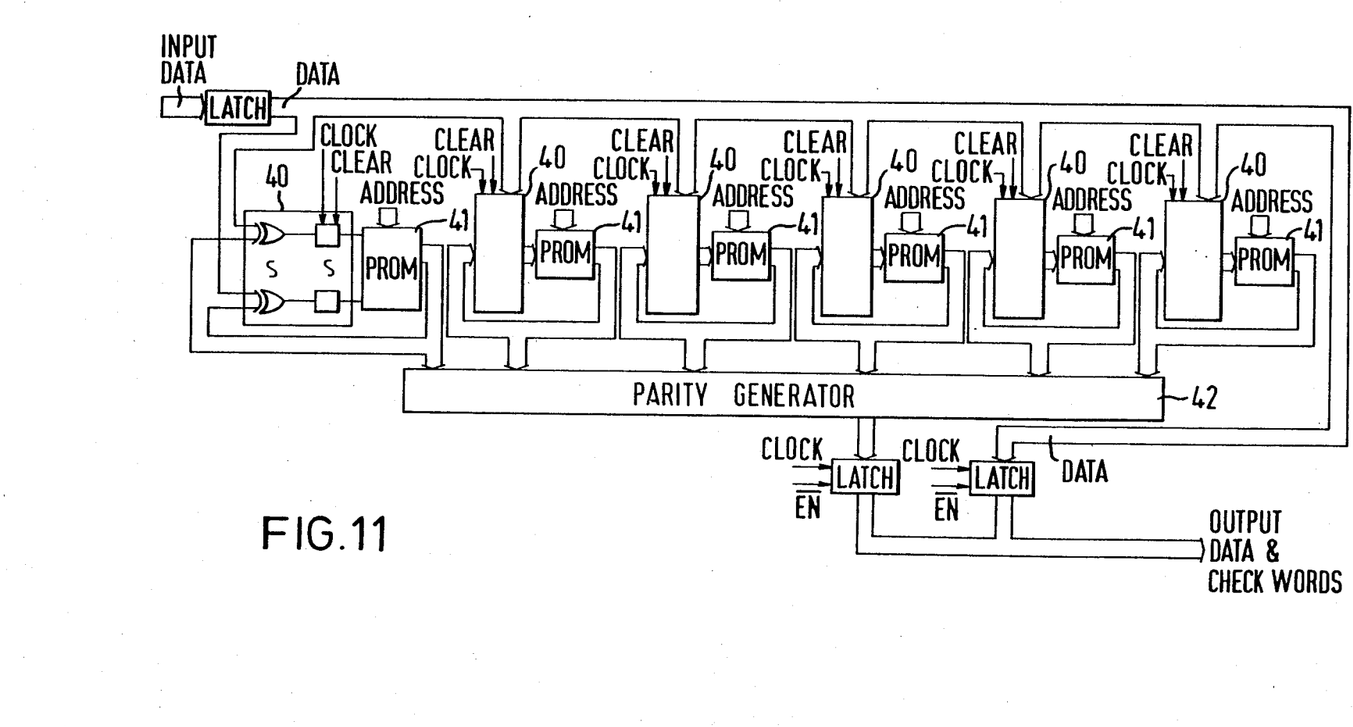
FIG. 11 shows in block form a code generator for use in an encoder.

The implementation of this determinant is, in practice, made simple by the availability of large PROMs. The requirement in the particular case is 2K by 8, that is, 11 address inputs and 8 outputs. The block diagram of the complete code generator is shown in FIG. 11. Each of the check words $K_0$ to $K_5$ is generated in the conventional manner using related primitive polynomial generators 40 as described above with reference to FIG. 10. Only the data words are used in this generation process. The output of each primitive polynomial generator 40 addresses a 6-way 8 to 8 code converter in the form of a 2K by 8 PROM 41, the outputs of which are connected to a parity generator 42. For each check word, one of the 8 to 8 code converter tables is accessed and the check word generated as a modulo-2 sum of all six modified "K" check word values. The check words $K_0$ to $K_5$ so generated are associated with the data block for transmission or recording.

The method of decoding at the decoder could be generally as described above in connection with the method using only two check words, but an improved method of decoding will now be described.

The first operation is to generate six syndromes from the sixty data words and the six check words of each data block. The coding structure described above results in the syndromes being available directly the last word, that is the sixth check word, of each data block is available. The syndromes are referred to as $S_0$, $S_1$, $S_2$, $S_3$, $S_4$, $S_5$.

Figure 12:
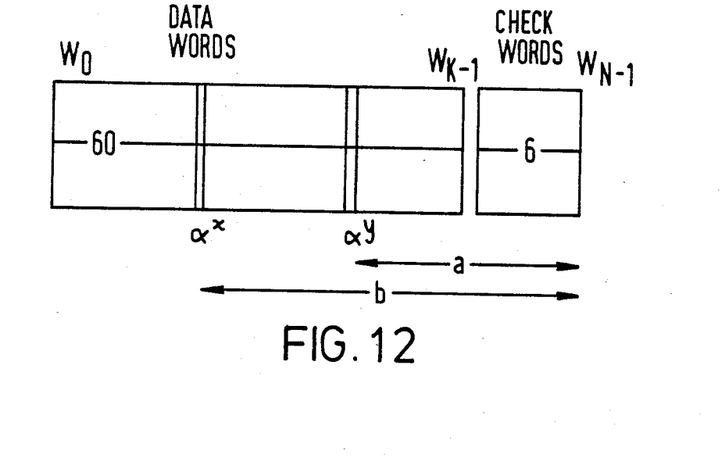
FIG. 12 indicates diagrammatically a still further block of data words with associated check words.

Referring to FIG. 12, assume that two errors of magnitude $\alpha^x$ and $\alpha^y$ occur in the data words and that the error locations are a and b respectively. The syndromes will therefore be:

$$S_0 = \alpha^x \oplus \alpha^y$$
$$S_1 = \alpha^x \cdot \alpha^a \oplus \alpha^y \cdot \alpha^b$$
$$S_2 = \alpha^x \cdot \alpha^{2a} \oplus \alpha^y \cdot \alpha^{2b}$$
$$S_3 = \alpha^x \cdot \alpha^{3a} \oplus \alpha^y \cdot \alpha^{3b}$$
$$S_4 = \alpha^x \cdot \alpha^{4a} \oplus \alpha^y \cdot \alpha^{4b}$$
$$S_5 = \alpha^x \cdot \alpha^{5a} \oplus \alpha^y \cdot \alpha^{5b} \quad (23)$$

As mentioned above, the circuitry required can be simplified by modifying the syndromes to avoid reverse stepping. This modification in effect transfers the syndromes from the end of the code to the beginning, a move of N time slots. Therefore $S_0$ is multiplied by $\alpha^0$, $S_1$ is multiplied by $\alpha^{-N}$, $S_2$ is multiplied by $\alpha^{-2N}$ and so on. The new syndromes $S_0$ to $S_5$ are then:

$$S'_0 = \alpha^x \oplus \alpha^y$$
$$S'_1 = \alpha^x \cdot \alpha^a \cdot \alpha^{-N} \oplus \alpha^y \cdot \alpha^b \cdot \alpha^{-N}$$
$$S'_2 = \alpha^x \cdot \alpha^{2a} \cdot \alpha^{-2N} \oplus \alpha^y \cdot \alpha^{2b} \cdot \alpha^{-2N}$$
$$S'_3 = \alpha^x \cdot \alpha^{3a} \cdot \alpha^{-3N} \oplus \alpha^y \cdot \alpha^{3b} \cdot \alpha^{-3N}$$

$$S'_4 = \alpha^x \cdot \alpha^{4a} \cdot \alpha^{-4N} \oplus \alpha^y \cdot \alpha^{4b} \cdot \alpha^{-4N}$$

$$S'_5 = \alpha^x \cdot \alpha^{5a} \cdot \alpha^{-5N} \oplus \alpha^y \cdot \alpha^{5b} \cdot \alpha^{-5N} \quad (24)$$

To locate the error positions a Chien search is done, in which each of the syndromes $S_1$ to $S_5$ is multiplied by $\alpha^1$ and modulo-2 added to the syndromes $S_0$ to $S_4$ respectively. After $(N-a)$ multiplications by $\alpha^1$ the following five equations result:

$$\begin{aligned}
P_0 &= \alpha^{N-a} \cdot S'_1 \oplus S'_0 \\
    &= \alpha^y \cdot \alpha^b \cdot \alpha^0(\alpha^{-a} \oplus \alpha^{-b}) \\
P_1 &= \alpha^{N-a} \cdot S'_2 \oplus S'_1 \\
    &= \alpha^y \cdot \alpha^{2b} \cdot \alpha^{-N}(\alpha^{-a} \oplus \alpha^{-b}) \\
P_2 &= \alpha^{N-a} \cdot S'_3 \oplus S'_2 \\
    &= \alpha^y \cdot \alpha^{3b} \cdot \alpha^{-2N}(\alpha^{-a} \oplus \alpha^{-b}) \\
P_3 &= \alpha^{N-a} \cdot S'_4 \oplus S'_3 \\
    &= \alpha^y \cdot \alpha^{4b} \cdot \alpha^{-3N}(\alpha^{-a} \oplus \alpha^{-b}) \\
P_4 &= \alpha^{N-a} \cdot S'_5 \oplus S'_4 \\
    &= \alpha^y \cdot \alpha^{5b} \cdot \alpha^{-4N}(\alpha^{-a} \oplus \alpha^{-b})
\end{aligned} \quad (25)$$

Hence:

$$\frac{P_1}{P_0} = \frac{P_2}{P_1} = \frac{P_3}{P_2} = \frac{P_4}{P_3} = \frac{\alpha^b}{\alpha^N} \quad (26)$$

These conditions are checked until one error is found. It should be noted that if there is only one error ($\alpha^x$) and hence $\alpha^y = 0$, then $P_0$, $P_1$, $P_2$, $P_3$ and $P_4$ are all zero and this condition also can readily be detected. Once the first error has been detected at the location a, the magnitude of the error $\alpha^x$ must be determined. This is done by generating the identity:

$$\alpha^{2(N-a)} \cdot S_2 \oplus S_0 = \alpha^y \cdot \alpha^{2b}(\alpha^{-2a} \oplus \alpha^{-2b}) = Q_0 \quad (27)$$

As:

$$(\alpha^{-a} \oplus \alpha^{-b})^2 = (\alpha^{-2a} \oplus \alpha^{-2b}) \quad (28)$$

Therefore:

$$\frac{P_0^2}{(\alpha^{2(N-a)} \cdot S'_2 \oplus S'_0)} = \alpha^y = \frac{P_0^2}{Q_0} \quad (29)$$

and $$\alpha^x = S'_0 \oplus \frac{P_0^2}{(\alpha^{2(N-a)} \cdot S'_2 \oplus S'_0)} = S'_0 \oplus \frac{P_0^2}{Q_0} \quad (30)$$

The error $\alpha^x$ is modulo-2 added to the data word at the location a to correct the error. The Chien search is then continued to find the location b, and then the magnitude of the error $e^y$ is determined as described above for the error $e^x$. The error $e^y$ is then modulo-2 added to the data word at the location b to correct the second error.

As described above the error location algorithm (26) requires a division process. This is best achieved using logarithms, and to avoid the subtraction steps the algorithm (26) can be re-written:

$$P_1^2 = P_0 \cdot P_2$$

$$P_2^2 = P_1 P_3$$

$$P_3^2 = P_2 P_4 \quad (31)$$

In this way simple gating is sufficient to indicate whether during the Chien search an error location has been found.

There are a number of options concerning the manner of using the decoding algorithm described above. Having regard to the relative probabilities of random errors and burst errors a preferred option is to use the check words for detecting and correcting the position and magnitude of two word errors, and to use the remaining capability for error detection. Errors so detected are flagged and may then be corrected using the vertical parity words. Thus in the initial double error processing only the first four of equations (23) and (24) are used, only the first three of equations (25) are used and only the first part of equation (31) is used. When two errors have been located and corrected, the two remaining check word generators can be used to generate two new syndromes, which should be the same as the syndromes generated from the corresponding check words.

An example of apparatus for effecting decoding in this way will now be described referring first to FIG. 13. The reproduced or received data blocks, are supplied by way of a data input 50 to an octal latch circuit 51, the output of which is connected to respective inputs of six primitive polynomial generators 52 and a delay 53. Each of the primitive polynomial generators 52 comprises a generator portion 54 shown in more detail in FIG. 14 and formed by an exclusive-OR circuit 54A and an octal latch circuit 54B. Each of the primitive polynomial generators 52 except the first also comprises a 512×8 PROM 55. A feedback extends from the output of each PROM 55 to a second input of the respective generator portion 54. No PROM 55 is necessary for the first primitive polynomial generator 52, which corresponds to FIG. 9A, except in that the exclusive-OR gates and the shift register stages are reversed in position.

For the reasons mentioned above, and in particular to avoid reverse stepping during the Chien searches, the syndromes generated are modified, and this function also is performed by the PROMs 55. For this purpose control signals are supplied by way of a terminal 56 to the most significant bit terminal of the first three PROMs 55 so that when the primitive polynomial generators 52 have completed generation of the respective syndrome at the receipt of the last word in the data block, the syndrome is then modified and the modified syndrome is supplied to a respective one of six octal latch circuits 57. The octal latch circuits 57 therefore respectively hold the modified syndromes $S_0$, $S_1$, $S_2$ and $S_3$ and the syndromes $S_4$ and $S_5$ for further processing while the next data block is being supplied to the data input 50.

Figure 15:
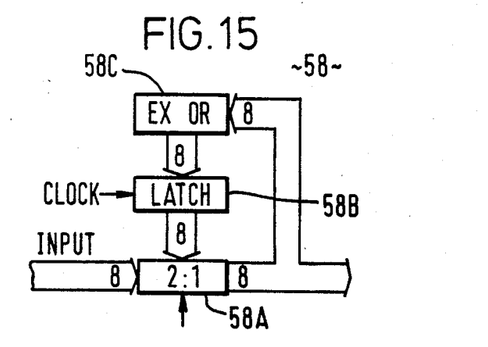
FIG. 15 shows a multiplier of the decoder of FIG. 13 in more detail.

The expressions $P_0$, $P_1$ and $P_2$ of equations (25) are then derived by multipliers 58 and exclusive-OR circuits 59. For example, the modified syndrome $S'_0$ is supplied to one input of the first exclusive-OR circuit 59 and the modified syndrome $S'_1$ is supplied by way of the first multiplier 58 to the other input of the first exclusive-OR circuit 59. Each of the multipliers 58 comprises, as shown in more detail in FIG. 15, an octal 2:1 selector 58A, an octal latch circuit 58B and three exclusive-OR gates forming an exclusive-OR circuit 58C. In the first clock cycle the input (syndrome) data is passed through the 2:1 selector 58. At the end of this clock cycle, the data is multiplied by $\alpha^1$ through the exclusive-OR circuit 58C and held by the octal latch circuit 58B. The 2:1 selector 58A selects the output of the octal latch circuit 58B for the remainder of the data block period, and at each clock cycle the data has been multiplied by $\alpha^1$. The first multiplier 58 multiplies the modified syndrome $S'_1$ by $\alpha^1$, and when this operation has been carried out (N−a) times, the output of the first exclusive-OR circuit 59 is $P_0$ as required by the first of equations (25). Likewise, the second exclusive-OR circuit 59 supplies $P_1$ and the third exclusive-OR circuit 59 supplies $P_2$.

The fourth exclusive-OR circuit 59 supplies a value $Q_0$ used in finding the error magnitude from $\alpha^{2(N-a)}S'_2 \oplus S'_0$ in equation (27).

The modified syndrome $S'_0$ is also supplied to an octal latch circuit 60 and to a comparator 61 where it is compared with zero to detect zero errors.

The next requirement is to check the first two parts of equation (26), that is:

$$\frac{P_1}{P_0} = \frac{P_2}{P_1} = \frac{\alpha^b}{\alpha^N} \qquad (26)$$

This is done by PROMs 62 which provide look-up tables, having in mind that the outputs of the exclusive-OR circuits 59 represent positions on the ring of FIG. 5. The outputs of the PROMs 62 are supplied to inputs of octal latch circuits 63, the outputs of the first and third octal latch circuits 63 being supplied to respective inputs of an adder 64 which supplies an output to a 512×8 PROM 65.

The four PROMs 62 respectively convert two values of $P_0$, $P_1$, $P_2$ and $Q_0$ into log form, in particular log ($P_0$), log ($P_1^2$), log ($P_2$) and log ($Q_0$). The adder 64 sums log ($P_0$) and log ($P_2$). This gives a 9-bit result which is converted back to an 8-bit code by the PROM 65, the result being held in an octal latch circuit 66. Another octal latch circuit 78 holds log ($P_1^2$). The outputs of the octal latch circuits 66 and 78 are supplied to a comparator 67 which supplies an output "1" when they are equal, that is:

$$\log(P_1^2) = \log(P_0) + \log(P_2) \qquad (32)$$

An error analysis PROM 68 has three inputs respectively connected to the outputs of the comparators 61 and 67 and of a NAND-gate circuit 79, the input of which is connected to the output of the octal latch circuit 78. The three inputs to the PROM 68 are decoded into four outputs, and the output is held in a latch circuit 69 for controlling subsequent stages. These four outputs represent:

(i) no error in the data block
(ii) one only error in the data block
(iii) two only errors in the data block
(iv) one or two errors in the data block.

Output (i) representing no error in the data block is supplied to one input address of a 32×2 PROM 96.

Output (ii) representing one error in the data block is latched into a counter 80. The counter 80 detects that only one pulse of output (ii) is present in any data block. Should there be zero or more than one single decoded error in the data block then single error correction is inhibited by the PROM 96.

Output (iii) representing two errors in the data block is latched into a counter 81. Similar to the one error case, two and only two errors must be decoded in each data block. If any other condition is detected, then double error correction is inhibited by the PROM 96.

Output (iv) is used to control a 2:1 selector 89 which, if an error is detected, switches through the data from an octal latch circuit 88. If no error is detected, then the 2:1 selector 89 supplies zero data.

Further inputs to the error analysis PROM 68 can be used to control whether the arrangement decodes single or double errors or neither.

The error pattern is generated by an adder 70 the output of which represents the log value of equation (29). A PROM 71 derives the antilog and the result ($\alpha^y$) is held in an octal latch circuit 72. The value of equation (30), ($\alpha^x$) is derived by an exclusive-OR circuit 73 and held in the octal latch circuit 88. If there are no errors, then the data held in the octal latch circuit 72, the modified syndrome $S'_0$ and the output of the exclusive-OR gate 73 will be zero. If there is one error only, then the data held in the octal latch circuit 72 will be zero and the modified syndrome $S'_0$ will have a magnitude equal to the error. Hence the error pattern will be available on the output of the exclusive-OR gate 73. The error pattern held in the octal latch circuit 88 is supplied to the 2:1 selector 89. If one or two error positions are decoded, then the error pattern is passed through to an octal latch circuit 90 and to an error pattern detector PROM 91.

The output of the octal latch circuit 90 is passed to a delay 76 for storage, and to syndrome generators 74 and 75. The syndrome generators 74 and 75 generate, in the same manner as the primitive polynomial generators 52, the values of two syndromes $S'_4$ and $S'_5$ and at the end of the data block these values are held in octal latch circuits 82 and 83. If the error pattern is valid, then the syndromes $S'_4$ and $S'_5$ will be equal to $S_4$ and $S_5$ respectively. This condition is detected by comparators 86 and 87 respectively. The output from the comparator 86 is used to enable the comparator 87, and hence the output of the comparator 87 represents the equality of both syndrome pairs. This output is used to control the PROM 96.

The error pattern from the 2:1 selector 89 is also supplied to the error pattern detector PROM 91 together with a word/bit control. When this control is in the word state, then the PROM 91 decodes every data pattern as valid via a valid two-error detector 92 and a 1K×1 PROM 94. If the control is in the bit state, then the input to the valid two-error detector 92 is valid only if a single bit error is decoded in the error word. Also, the input to a valid burst error detector 93 is valid if only two sequential error words are representative of a 9-bit or less error pattern. The results of these tests are supplied to the PROM 94 which decodes the valid error patterns and supplies a control signal via a latch circuit 95 to the PROM 96.

The inputs to the PROM 96 enable zero, single and two-error patterns to be decoded and enable, via a latch circuit 97, the output of an octal latch circuit 98 to correct the errors in the data via an exclusive-OR gate 77 to which the data is also supplied from the delay 53.

A second output from the PROM 96 via the latch circuit 97 is used to supply a signal to an output 84 to indicate that an uncorrectable error pattern has been found, and this is then used for decoding using the vertical parity check words.

To summarise, therefore, if there are no errors the 2:1 selector 89 will select the all "0" signal. If there is a single error, then the PROM 71 will effectively be disabled and the output of the exclusive-OR circuit 73 will be the modified syndrome $S'_0$. If, however, there are two errors the PROM 71 will be operative and the magnitudes of the errors will be found as described above. In all cases, therefore, the output of the 2:1 selector 89 will be the error pattern, although in cases where there are no errors, the error pattern will be all "0". The error pattern is supplied to the delay 76 and thence to one input of the exclusive-OR circuit 77 to be modulo-2 added to the data which is supplied to the other input of the exclusive-OR circuit 77 from the delay 53. In this way the errors in the data are corrected and the corrected data is supplied to an output 85.

Additionally, for checking purposes, the error pattern from the 2:1 selector 89 is supplied to the syndrome generators 74 and 75. The check is effected making use of the latter part of equation (26). Briefly, the fifth and sixth primitive polynomial generators 52 generate the syndromes $S_4$ and $S_5$ and they are supplied by way of the fifth and sixth latch circuits 57 and the octal latch circuits 85 and 95 to the comparators 86 and 87. A simple comparison in each of the comparators 86 and 87 is all that is necessary. If the error pattern which has been derived as described above and which is supplied to the syndrome generators 74 and 75 is the same as the error pattern in the original data, then the syndromes $S_4$ and $S_5$ supplied to the comparators 86 and 87 respectively from the fifth primitive polynomial generator 52 and the syndrome generator 74, and from the sixth polynomial generator 52 and the syndrome generator 75 will be the same, and an "error valid" signal will be supplied from the comparator 87 to the PROM 96.

There are a number of options available at this point. For example, the error-corrected data can be allowed through, it being accepted that the error correction will have failed if there are more than about five errors in the block. This may give a failure rate of about 1 in $10^6$ and this may well not be acceptable. To improve the failure rate to about 1 in $10^9$ some additional protection is provided, as will now be described.

This is done by restricting the individual error corrections that are applied to any 9-bit burst pattern or any 2-bit random error pattern. This is done after detecting a single error or a double error pattern. Any single error pattern is within the above criteria because any 8-bit word is within a 9-bit burst (the converse is not true). This is detected by the error pattern detector PROM 91 which checks each error pattern.

Each time there is a double error pattern located it is analysed by the error pattern detector PROM 91. The PROM 91 is an 8-to-7 code converter, the top bit indicating the presence of a non-zero input pattern, the next three bits of the output indicating in binary coded decimal the distance of the first error bit from the end of the first word and the bottom three bits of the output indicating in binary coded decimal the distance of the second error bit from the beginning of the second word. These binary coded decimal values are supplied by the latch circuit 95 to the PROM 96. Only therefore if one of the criteria mentioned above is satisfied with the delay 76 be enabled to use the error patterns which have been derived to correct the data, by supplying them to the exclusive-OR circuit 77. If neither criteria is satisfied it is assumed that the errors cannot be corrected and the data is passed uncorrected and is flagged as being in error for subsequent vertical parity correction if this is possible, or, if not, for concealment. Likewise if the syndromes were non-zero, but no error pattern is found in the data block, it is again assumed that there are errors which cannot be corrected.

It will be appreciated that the operation is the same whether the errors are in the data words or in the check words, and no special processing is required to determine whether the errors are in the check words or the data words.

Further consideration will now be given to the vertical parity correction. Prior to recording, the vertical parity words for the parity check blocks to be associated with the data blocks of each segment are generated by a vertical parity word generator generally as shown in FIG. 3. In this case the delay 5 has a delay time of six horizontal scan lines minus one sample. The input supplied to the input 1 comprises the data words, and, with the appropriate timing, all "0" words for the parity positions. Six lines of vertical parity words are generated for each segment comprising parts of 96 or 102 horizontal scan lines.

Figure 13A:
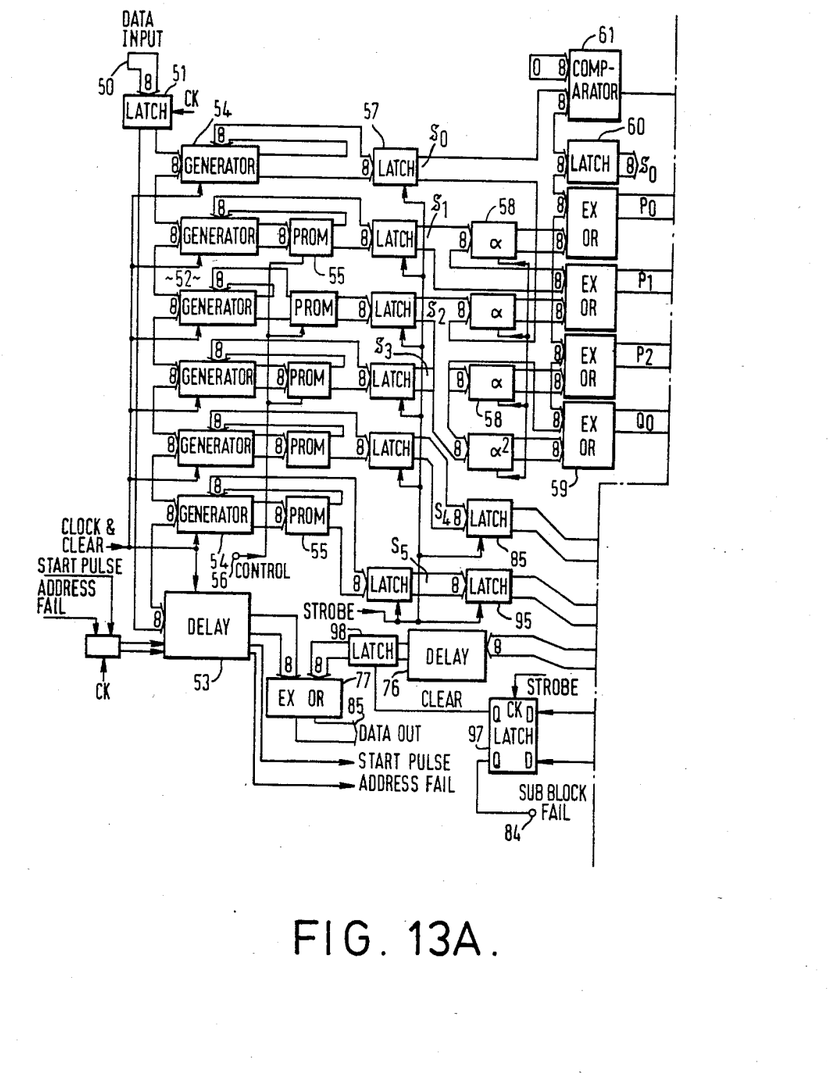
FIGS. 13A and 13B which are drawn on separate sheets due to space limitations, and which together form a single figure referred to as FIG. 13, show in block form the main part of a decoder.
Figure 13B:
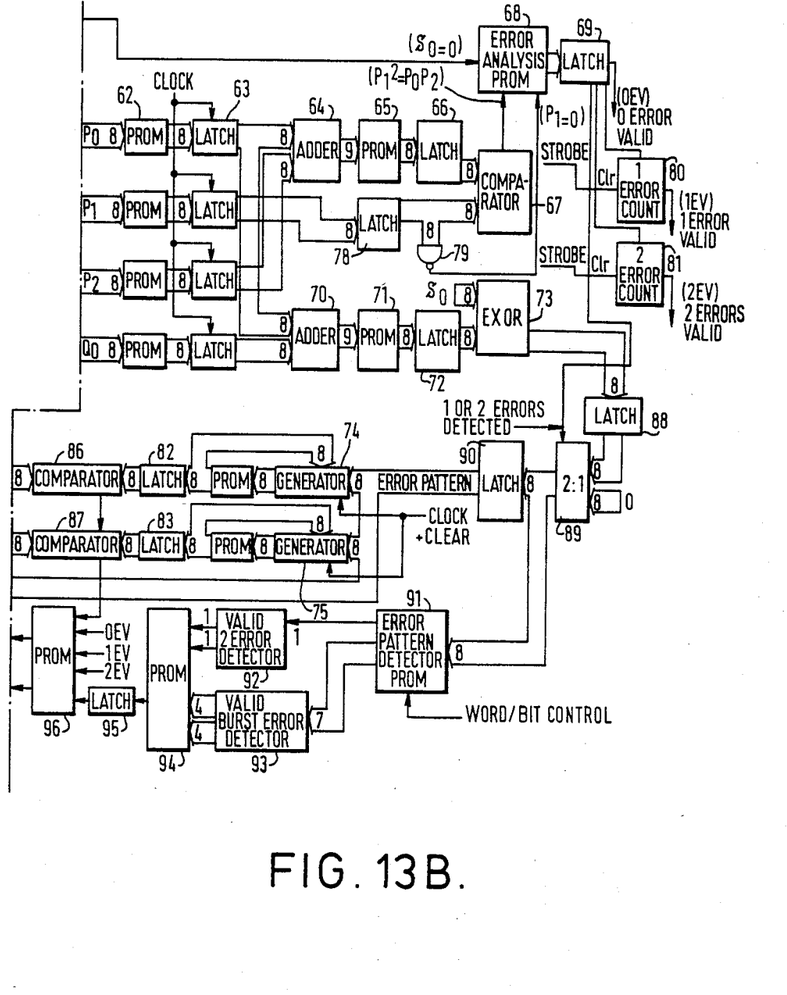
Figure 14:
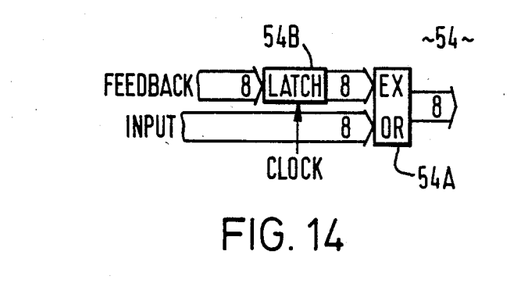
FIG. 14 shows a generator of the decoder of FIG. 13 in more detail.
Figure 16:
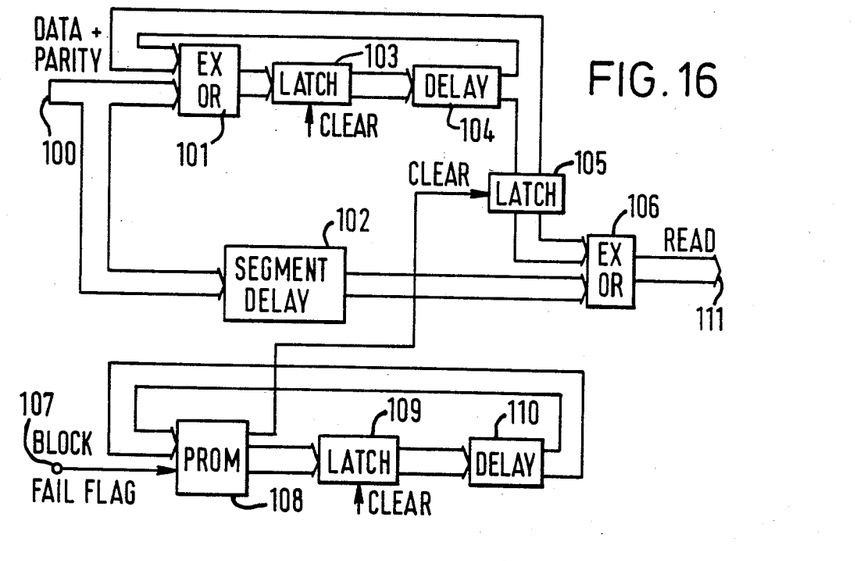
FIG. 16 shows in block form a vertical parity check arrangement forming another part of the decoder.

After reproduction, and after processing of the data words and the check words in the apparatus of FIG. 13, the data words and the vertical parity words are supplied segment by segment to the input 100 of the vertical parity check arrangement which forms another part of the decoder and which is shown in block form in FIG. 16.

The input 100 is connected to one input of an exclusive-OR circuit 101 and to the input of an segment delay 102. The output of the exclusive-OR circuit 101 is connected by way of a latch circuit 103 to the input of a six lines minus one sample delay 104, the output of which is connected back to a second input of the exclusive-OR circuit 101. The output of the delay 104 is also connected by way of a latch circuit 105 to one input of an exclusive-OR 106. The output of the segment delay 102 is connected to the other input of the exclusive-OR circuit 106.

Data invalid flags, such as signals generated in the apparatus of FIG. 13, and indicating uncorrected errors, are supplied by way of another input 107 to an input of a PROM 108. The output of the PROM 108 is connected by way of a latch circuit 109 to a six line delay 110, the output of which is connected back to the data input of the PROM 108. The PROM 108 also has an output for supplying a clear signal to the latch circuit 105.

In operation the syndromes are generated by the loop comprising the exclusive-OR circuit 101, the latch circuit 103 and the delay 104. At the end of 96 or 102 lines, the delay 104 supplies the syndrome pattern to the latch circuit 105. Meanwhile, the PROM 108 has generated a 2-bit code which identifies for each data block syndrome whether there are zero, one or more than one errors in the segment corresponding to that syndrome data block. Correction is effected by the exclusive-OR circuit 106 which modulo-2 sums the data delayed by the delay 102 with the syndrome held in the latch circuit 105. However, this only occurs when the PROM 108 indicates that there is only a single error pattern. In other cases the PROM 108 clears the latch circuit 105 so that an all "zero" pattern is modulo-2 summed with the data by the exclusive-OR circuit 108. The exclusive-OR circuit then supplies the resulting data to an output 111. In general, if at this stage some of the data is still flagged as being in error, because the errors therein cannot be detected or cannot be corrected by the method described above, then the errors will be concealed.

Although the methods and apparatus described are particularly advantageous when applied to digital television signals, there may be circumstances in which they can be applied to other forms of data.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of correcting errors in binary data words, the method comprising the steps of: deriving a plurality of check words in dependence on all of a plurality of said data words and in dependence on each other said check word, wherein one said check word is derived by modulo-2 addition and each of the remaining ones of said check words is derived by a respective primitive polynomial generator each using a respective function of an extension field of a common generator polynomial, assembling said plurality of data words and said plurality of check words into a data block, and deriving a parity check block for a plurality of said data blocks.

2. A method according to claim 1 wherein after transmission and reception or recording and reproduction of said binary data, the method includes the steps of: using said derived check words to detect and to correct errors in said data words and in said check words, and using said derived parity check block to correct errors in said data words which have been detected by but not corrected by said check words.

3. A method according to claim 1 wherein said binary data represents a digital television signal and the step of deriving said parity check block includes the step of modulo-2 addition of a plurality of said data blocks, said data blocks respectively belonging to spaced horizontal line scans in a television signal.

4. A method according to claim 3 wherein said plurality of check words is six.

5. A method according to claim 4 wherein after transmission and reception or recording and reproduction of said binary data, the method includes the further steps of generating six syndromes for each said data block from the received or reproduced data words and check words of said data block, using four of said syndromes to detect errors and to derive error positions and error patterns for correcting said errors and using the remaining two syndromes to check the validity of said derived error patterns.

6. A method according to claim 2 where said data words and said check words are each 8-bit words and said check words are used to correct errors in said data words and said check words when an error pattern detected by said check words is either a 9-bit burst error or any 2-bit error pattern.

7. A method according to claim 1 wherein said binary data represents a digital television signal, said plurality of data words is sixty and said plurality of check words is six.

8. Apparatus for use in correcting errors in binary data words, the apparatus comprising check word generator means receiving a plurality of said binary data words for deriving a plurality of check words, each said check word being derived in dependence on all said plurality of said data words and in dependence on each other said check word, said check word generator means including means for generating one of said check words in said plurality of check words by modulo-2 addition and primitive polynomial generator means for generating each of the remaining ones of said check words in said plurality of check words by using a respective function of an extension field of a common generator polynomial, means for assembling said plurality of data words and said plurality of check words derived therefrom into a data block, and parity check block generator means for further deriving a parity check block for a plurality of said data blocks.

9. Apparatus according to claim 8 wherein said binary data represents a digital television signal and said parity check block generator means further includes means for deriving said parity check block by modulo-2 addition of a plurality of said data blocks respectively belonging to spaced horizontal line scans in a television signal.

* * * * *